United States Patent
Tang et al.

(10) Patent No.: US 10,395,926 B1
(45) Date of Patent: Aug. 27, 2019

(54) MULTIPLE PATTERNING WITH MANDREL CUTS FORMED USING A BLOCK MASK

(71) Applicant: GLOBALFOUNDRIES Inc., Grand Cayman (KY)

(72) Inventors: Minghao Tang, Ballston Lake, NY (US); Yuping Ren, Clifton Park, NY (US); Sean Xuan Lin, Watervliet, NY (US); Shao Beng Law, Watervliet, NY (US); Genevieve Beique, Clifton Park, NY (US); Xun Xiang, Albany, NY (US); Rui Chen, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/954,736

(22) Filed: Apr. 17, 2018

(51) Int. Cl.
*H01L 21/033* (2006.01)
*H01L 21/311* (2006.01)
*H01L 21/768* (2006.01)

(52) U.S. Cl.
CPC ...... *H01L 21/0337* (2013.01); *H01L 21/0332* (2013.01); *H01L 21/31144* (2013.01); *H01L 21/76816* (2013.01)

(58) Field of Classification Search
CPC .......... H01L 21/31116; H01L 21/7685; H01L 21/76833; H01L 21/3086; H01L 21/02181; H01L 21/0337; H01L 21/0332; H01L 21/31144; H01L 21/76816

USPC ...... 216/41, 46, 47; 438/706, 710, 714, 717, 438/719, 723, 736
See application file for complete search history.

(56) References Cited

U.S. PATENT DOCUMENTS

| | | | |
|---|---|---|---|
| 8,850,369 B2 | 9/2014 | Lung et al. | |
| 9,177,797 B2 | 11/2015 | Chang et al. | |
| 9,390,709 B2 | 7/2016 | Nonaka | |
| 9,551,923 B2 | 1/2017 | Wang et al. | |
| 10,002,797 B1* | 6/2018 | Pandey | H01L 21/8249 |
| 2013/0313647 A1* | 11/2013 | Aquilino | H01L 21/82380 257/368 |
| 2014/0027820 A1* | 1/2014 | Aquilino | H01L 21/76232 257/288 |
| 2015/0255284 A1* | 9/2015 | Bristol | H01L 23/528 257/774 |

* cited by examiner

*Primary Examiner* — Lan Vinh
(74) *Attorney, Agent, or Firm* — Thompson Hine LLP; Anthony Canale

(57) ABSTRACT

Methods of self-aligned multiple patterning. A mandrel line is formed over a hardmask layer, and forming a block mask is formed over a first portion of the mandrel line that is linearly arranged between respective second portions of the mandrel line. After forming the first block mask, the second portions of the mandrel line are removed with an etching process to cut the mandrel line and expose respective portions of the hardmask layer. A second portion of the mandrel line is covered by the block mask during the etching process to define a mandrel cut in the mandrel line.

20 Claims, 12 Drawing Sheets

MULTIPLE PATTERNING WITH MANDREL CUTS FORMED USING A BLOCK MASK

BACKGROUND

The present invention relates to semiconductor device fabrication and integrated circuits and, more specifically, to methods of multiple patterning.

A back-end-of-line (BEOL) interconnect structure may be used to connect device structures fabricated on a substrate during front-end-of-line (FEOL) processing with each other and with the environment external to the chip. Self-aligned patterning processes used to form a BEOL interconnect structure involve mandrel lines as sacrificial features that establish a feature pitch. Sidewall spacers are formed adjacent to the sidewalls of the mandrel lines. After selective removal of the mandrel lines, the spacers are used as an etch mask to etch an underlying hardmask over areas exposed by mandrel removal and areas between the spacers. The pattern is transferred from the hardmask to an interlayer dielectric layer to define trenches in which the wires of the BEOL interconnect structure are formed.

Improved methods of multiple patterning are needed.

SUMMARY

In an embodiment of the invention, a method includes forming a mandrel line over a hardmask layer, and forming a block mask over a first portion of the mandrel line that is linearly arranged between respective second portions of the mandrel line. The method further includes, after forming the first block mask, removing the second portions of the first mandrel line with a first etching process to cut the first mandrel line and expose respective first portions of the hardmask layer. A second portion of the first mandrel line is covered by the first block mask during the first etching process to define a mandrel cut in the first mandrel line.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 9A is a top view of the structure in which FIG. 9 is taken generally along line 9-9.

FIG. 13A is a top view of the structure in which FIG. 13 is taken generally along line 13-13.

FIG. 14A is a top view of the structure in which FIG. 14 is taken generally along line 14-14.

DETAILED DESCRIPTION

Figure 1:
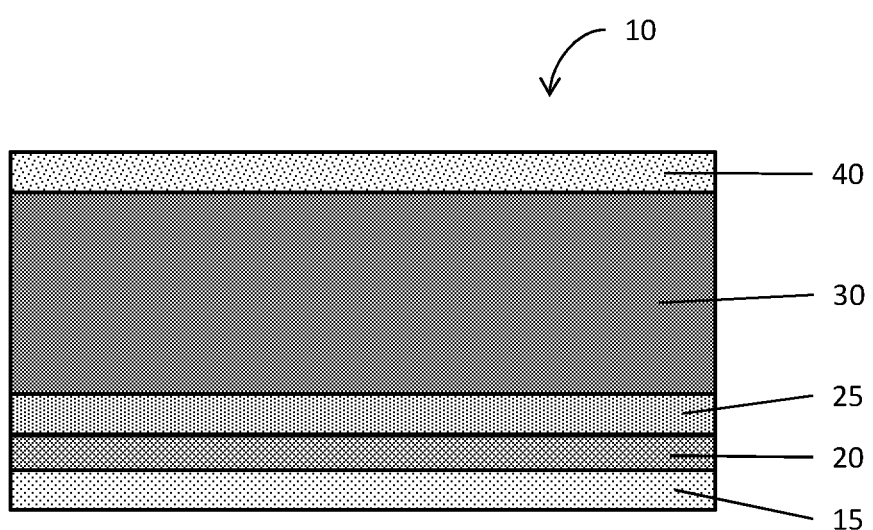
FIGS. 1-20 are cross-sectional views of a structure at successive fabrication stages of a processing method in accordance with embodiments of the invention.

With reference to FIG. 1 and in accordance with embodiments of the invention, a structure 10 includes a lower hardmask layer 20, an upper hardmask layer 25, a mandrel layer 30, and a mandrel patterning layer 40 serially deposited on an interlayer dielectric layer 15. The interlayer dielectric layer 15 may be comprised of an electrically-insulating dielectric material, such as hydrogen-enriched silicon oxycarbide (SiCOH) or another type of low-k dielectric material, deposited by chemical vapor deposition (CVD). The interlayer dielectric layer 15 may be located on a substrate (not shown) that includes device structures fabricated by front-end-of-line (FEOL) processing to form an integrated circuit. The lower hardmask layer 20 may be comprised of any suitable metal-based material, such as titanium nitride (TiN). The upper hardmask layer 25 may be comprised of any suitable dielectric material, such as silicon nitride. The mandrel layer 30 may, for example, be comprised of amorphous silicon ($\alpha$-Si) or another material used to form mandrel lines in multiple patterning processes, such as self-aligned double-patterning (SADP) or self-aligned quadruple-patterning (SAQP) processes. The mandrel patterning layer 40 may be comprised of a dielectric material, such as a low-temperature oxide (LTO) of silicon.

Figure 2:
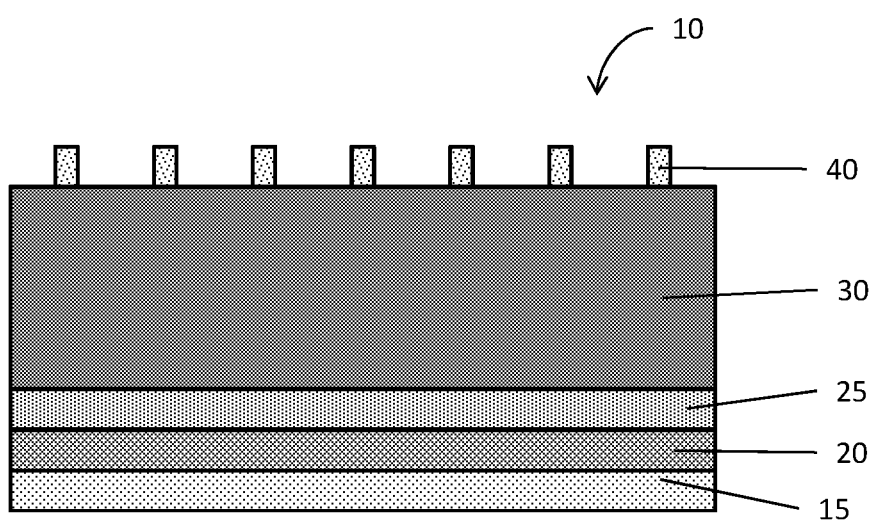

With reference to FIG. 2 in which like reference numerals refer to like features in FIG. 1 and at a subsequent fabrication stage of the processing method, mandrel patterning layer 40 is patterned to expose portions of mandrel layer 30 to be etched and removed, as described below. The mandrel patterning layer 40 may be patterned by, for example, a lithography and etch process. To that end, a lithography stack (not shown) may be provided over structure 10 and a patterned resist layer may be provided over the lithography stack, where the patterned resist layer includes openings corresponding to portions of mandrel layer 30 to be removed. The lithography stack is patterned with an etching process while masked by the patterned resist layer to expose portions of the mandrel patterning layer 40 to be removed, and the exposed portions of the mandrel patterning layer 40 are then etched and removed to expose underlying portions of the mandrel layer 30.

In conventional fabrication processes, cuts to be formed in mandrel lines are generally defined by cutting the patterned the mandrel patterning layer 40 prior to etching the mandrel layer 30. However, forming cuts in the mandrel lines in this manner may be undesirable for several reasons. For example, conventional mandrel line cuts are generally limited in width by the width of spacers formed on sidewalls of the cut mandrel lines, and generally are limited to provide an end-to-end spacing between the ends of the cut mandrel lines that is less than or equal to twice the spacer thickness, which may limit flexibility in the design of metallization lines. As another example, the spacers follow the contour of the sidewalls of the mandrel lines and merge within the cuts, which produces gaps or indentations between the converging spacers at the edges of the cuts, leading to a "necking" distortion effect in the non-mandrel lines at these gaps. At later stages when the non-mandrel lines are etched into masking layers, the non-mandrel lines are distorted and wider than designed at the locations of these gaps, leading to distorted metallization lines that may be insufficiently separated from adjacent metallization lines and potentially leading to shorts in the circuit structure. In the processes described herein, cuts in the mandrel lines 35 are not formed until after the non-mandrel lines 60 have been patterned, cut, and etched into the upper hardmask layer 25, as described below. This avoids distortions being formed in the non-mandrel lines 60 and also allows for greater design flexibility as the mandrel line cuts are not limited by spacer thickness.

Figure 3:
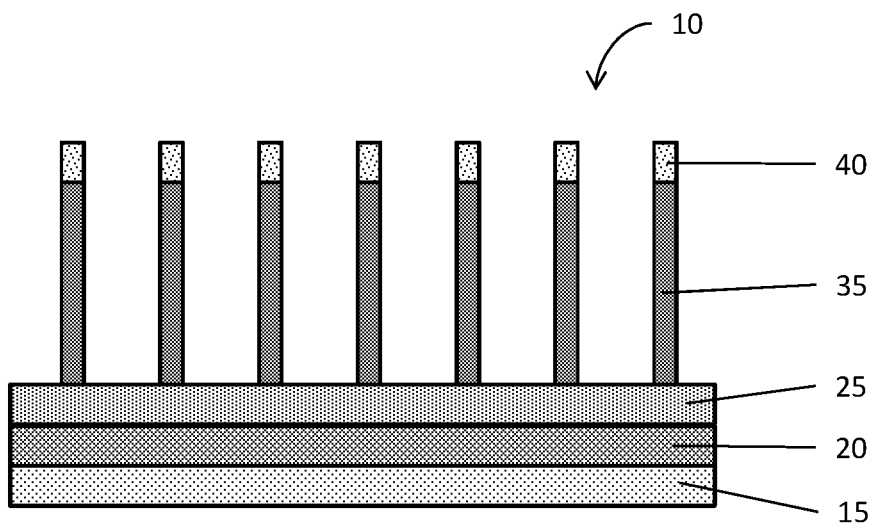

With reference to FIG. 3 in which like reference numerals refer to like features in FIG. 2 and at a subsequent fabrication stage of the processing method, mandrel layer 30 is etched to form mandrel lines 35 that are arranged over the upper hardmask layer 25. The etching of mandrel layer 30 may comprise a selective anisotropic reactive ion etch (ME) process, for example, to remove the material of the mandrel layer 30 selective to the materials of the upper hardmask layer 25 and the mandrel patterning layer 40. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 4:
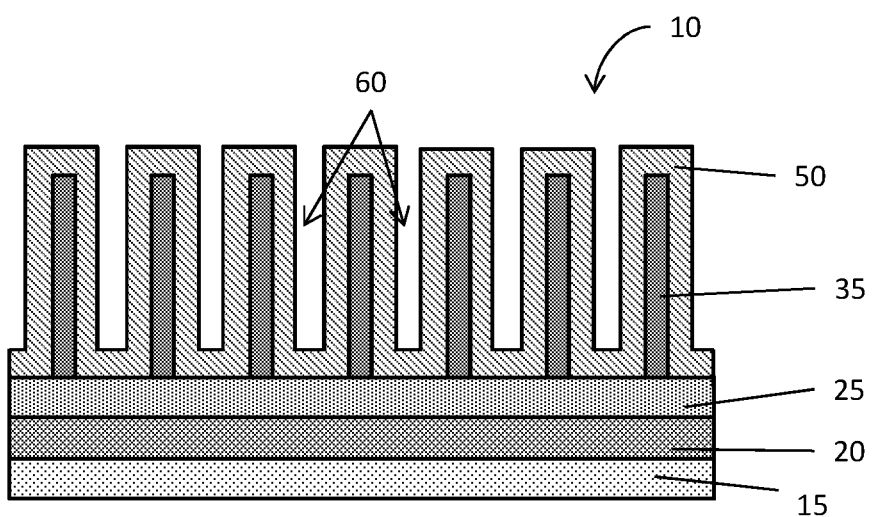

With reference to FIG. 4 in which like reference numerals refer to like features in FIG. 3 and at a subsequent fabrication stage of the processing method, the mandrel patterning layer 40 is removed and a spacer layer 50 is deposited over mandrel lines 35. The mandrel patterning layer 40 may be removed, for example, by a selective wet etch process. The spacer layer 50 may be a conformal layer deposited by any deposition technique, such as chemical vapor deposition (CVD) or atomic layer deposition (ALD), and may be comprised of an oxide of silicon, an oxide of titanium, or other dielectric material. Gaps between the spacer layer 50 on sidewalls of adjacent mandrel lines 35 define non-mandrel lines 60 that are disposed between adjacent pairs of mandrel lines 35 and that are also covered by the deposited spacer layer 50.

Figure 5:
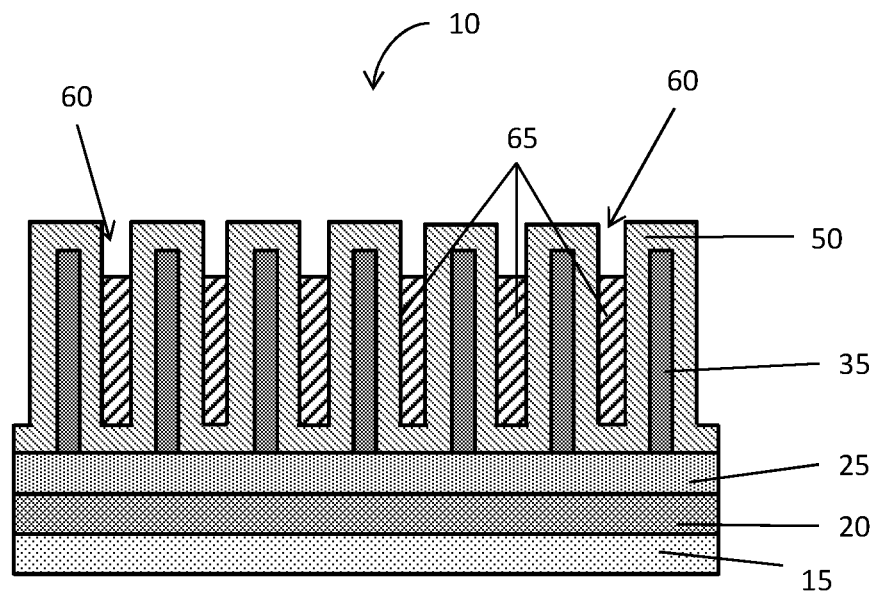

With reference to FIG. 5 in which like reference numerals refer to like features in FIG. 4 and at a subsequent fabrication stage of the processing method, a spin-on hardmask (SOH) 65 is formed over the structure 10 and subsequently etched back to expose top portions of spacer layer 50 that are arranged over the top surfaces of mandrel lines 35. The spin-on hardmask 65 may be comprised of an organic material, for example, an organic planarization layer (OPL) material. The spin-on hardmask 65 fills the non-mandrel lines 60 and covers portions of spacer layer 50 overlying the upper hardmask layer 25, which serves to protect these portions of spacer layer 50 in subsequent processing stages.

Figure 6:
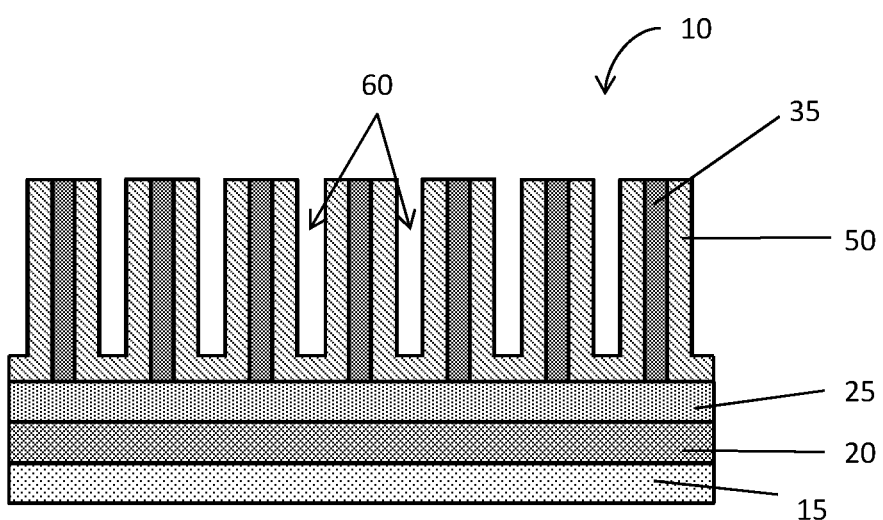

With reference to FIG. 6 in which like reference numerals refer to like features in FIG. 5 and at a subsequent fabrication stage of the processing method, the unmasked and exposed portions of the spacer layer 50 are etched and removed to expose the respective top surfaces of mandrel lines 35, which is subsequently needed for mandrel pull. The spacer layer 50 may be etched, for example, by a timed anisotropic reactive ion etching (ME) process. The spin-on hardmask 65, which is resistant to the etching process, covers and protects portions of spacer layer 50 that are arranged over the non-mandrel lines 60 and above the upper hardmask layer 25. After etching the top portions of the spacer layer 50, the remaining portions of the spin-on hardmask 65 are removed, for example, by an ash process.

Figure 7:
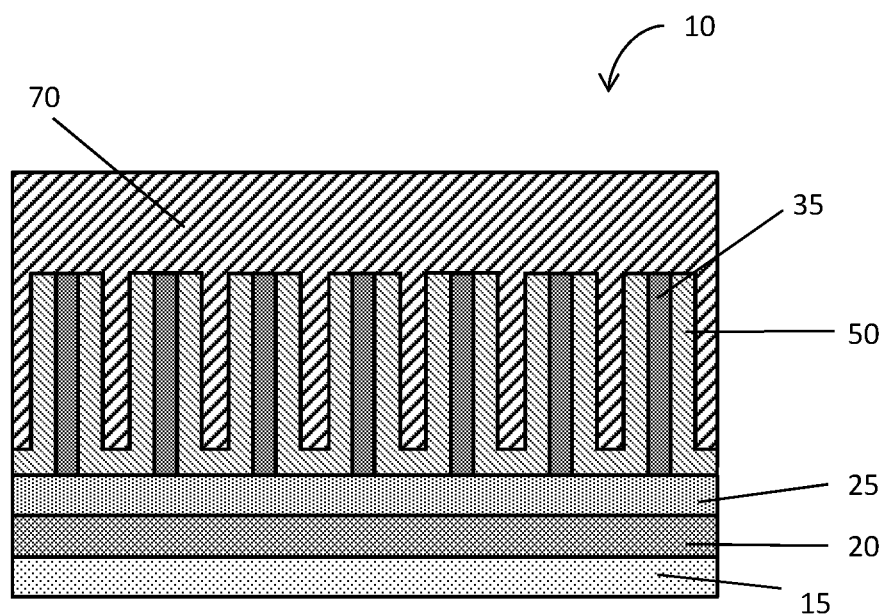

With reference to FIG. 7 in which like reference numerals refer to like features in FIG. 6 and at a subsequent fabrication stage of the processing method, a spin-on hardmask 70 is formed over structure 10. The spin-on hardmask 70 may be comprised of the same material as spin-on hardmask 65 (FIG. 6), such as an organic planarization layer (OPL) material, or may be comprised of a different material.

Figure 8:
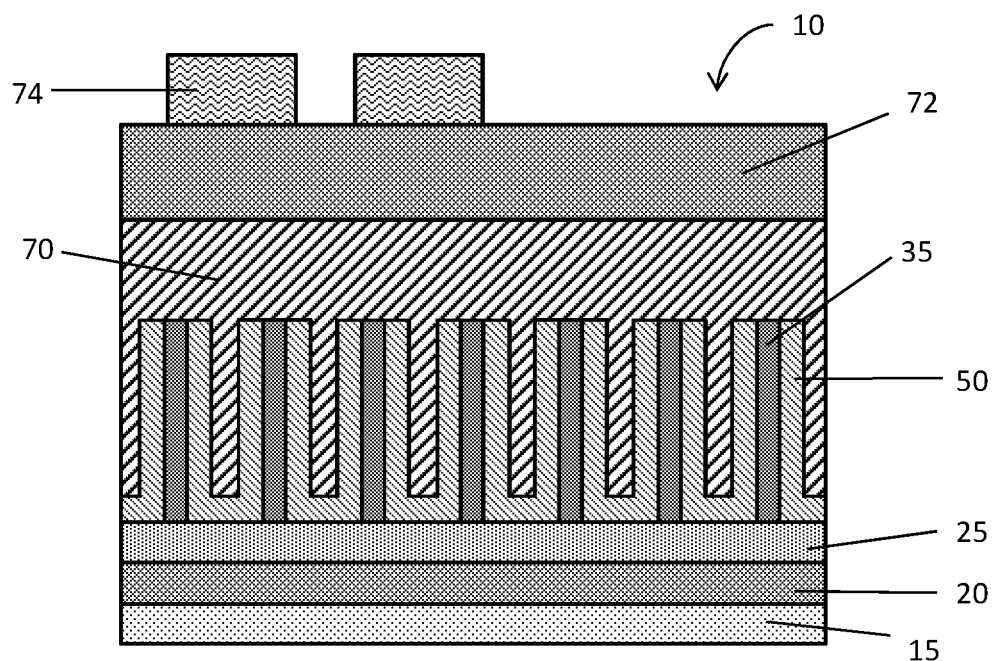

With reference to FIG. 8 in which like reference numerals refer to like features in FIG. 7 and at a subsequent fabrication stage of the processing method, a lithography stack 72 and patterned resist 74 are formed over spin-on hardmask 70. Lithography stack 72 may include one or more photolithography layers, such as an anti-reflective layer, a hardmask layer, and a planarization layer. The patterned resist 74 is patterned to form blocks covering areas of the lithography stack that are subsequently used to form non-mandrel cuts in the hardmask layers 20, 25, as further described below.

Figure 9:
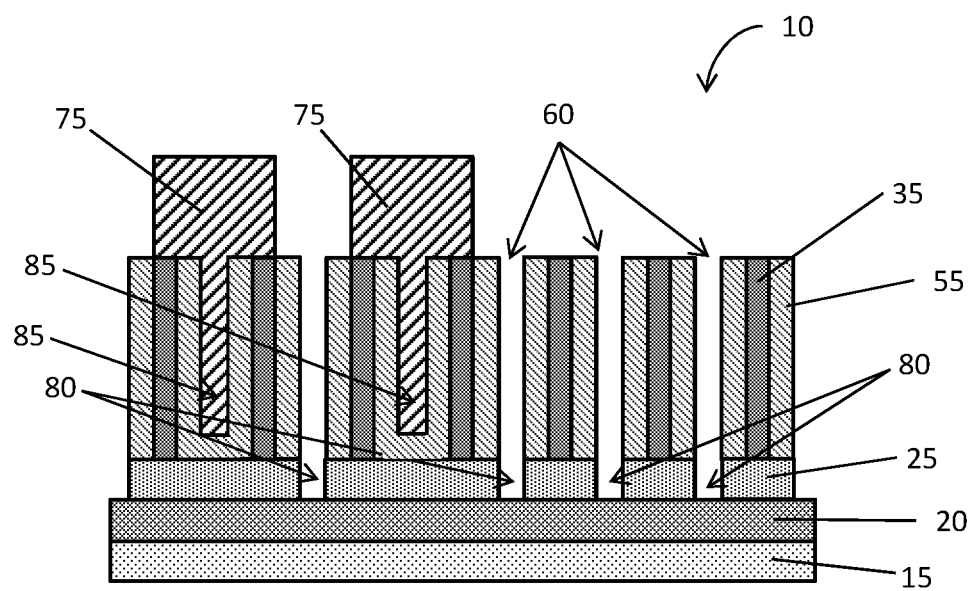
Figure 9A:
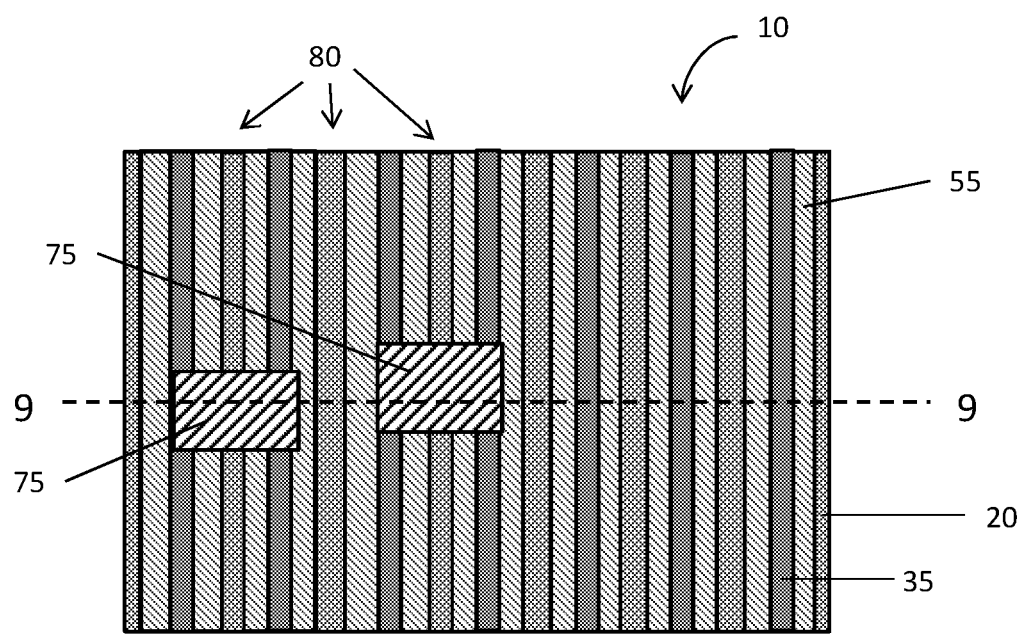

With reference to FIGS. 9 and 9A in which like reference numerals refer to like features in FIG. 8 and at a subsequent fabrication stage of the processing method, unmasked portions of the lithography stack 72 are etched and removed to expose portions of spin-on hardmask 70, and the exposed portions of spin-on hardmask 70 are etched and removed to expose portions of the spacer layer 50 overlying upper hardmask layer 25, leaving non-mandrel block masks 75 as remnants of the patterning. The exposed portions of the spacer layer 50 are etched and removed to form spacers 55 on the sidewalls of the mandrel lines 35, and the underlying portions of the upper hardmask layer 25 exposed by the removal of the exposed portions of the spacer layer 50 are subsequently etched to form non-mandrel line trenches 80 in the upper hardmask layer 25. The non-mandrel block masks 75 protect underlying portions of the upper hardmask layer 25 from the trench etch to form one or more non-mandrel cuts, generally indicated by reference numeral 85. The non-mandrel line trenches 80 in upper hardmask layer 25 and the exposed portions of spacer layer 50 may be etched successively with a single etching process, such as an anisotropic RIE process that removes their respective materials selective to the materials of the spacer layer 50 and the upper hardmask layer 25, or may be etched instead in separate etching stages. Remaining portions of the spin-on hardmask 70, lithography stack 72, and patterned resist 74 are removed after the non-mandrel line trenches 80 and non-mandrel cuts are formed.

Figure 10:
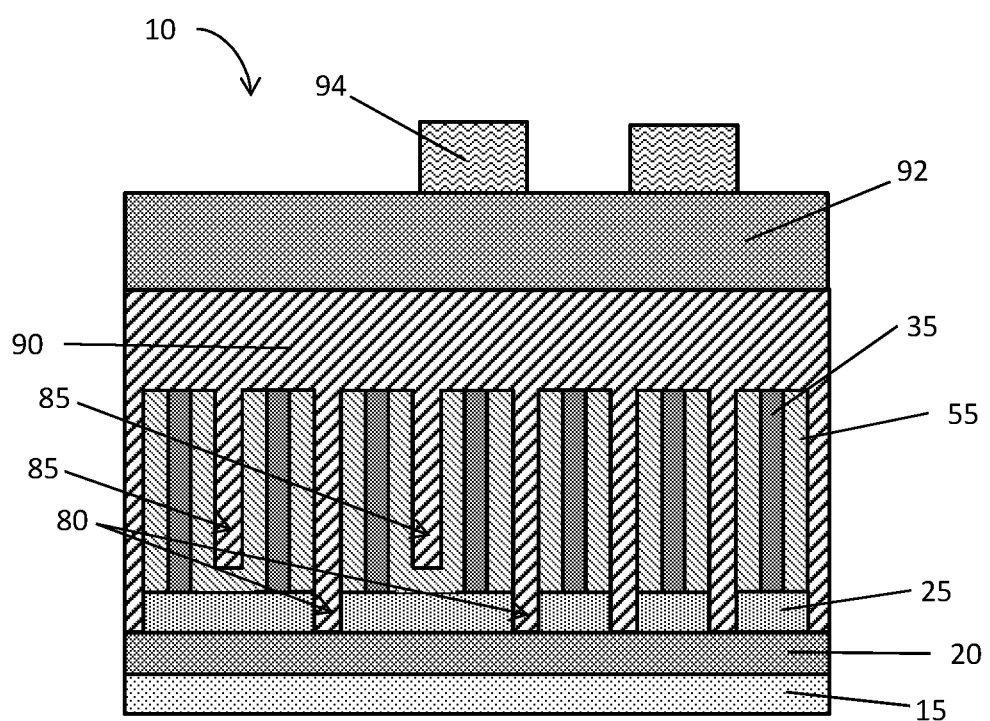

With reference to FIG. 10 in which like reference numerals refer to like features in FIGS. 9 and 9A and at a subsequent fabrication stage of the processing method, a spin-on hardmask 90 is formed over structure 10, and another lithography stack 92 and patterned resist 94 are formed over the spin-on hardmask 90. Spin-on hardmask 90 may be comprised of the same material as either or both of spin-on hardmask 65 and spin-on hardmask 70, or may be comprised of a different material. The spin-on hardmask 90 covers mandrel lines 35, non-mandrel line trenches 80, and non-mandrel cuts 85. Lithography stack 92 may include one or more photolithography layers, such as an anti-reflective layer, a hardmask layer, and a planarization layer. The patterned resist 94 is patterned to form blocks covering areas of the lithography stack that are subsequently used to form mandrel cuts in the hardmask layers 20, 25, as further described below.

Figure 11:
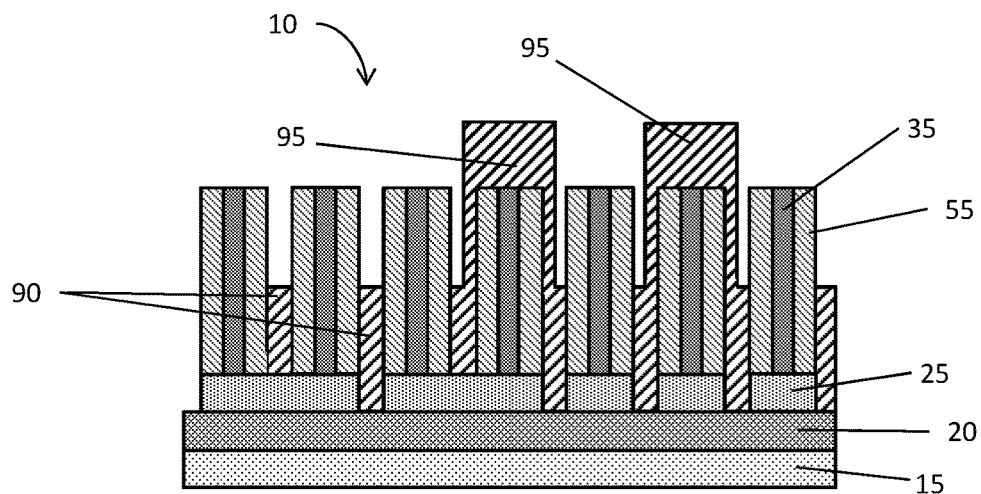

With reference to FIG. 11 in which like reference numerals refer to like features in FIG. 10 and at a subsequent fabrication stage of the processing method, unmasked portions of the lithography stack 92 are etched and removed to expose portions of spin-on hardmask 90, and these exposed portions of spin-on hardmask 90 are etched back to expose mandrel lines 35. Mandrel line block masks 95 remain as remnants of the patterned spin-on hardmask 90. Portions of the spin-on hardmask 90 also fill the non-mandrel line trenches 80 in the lower hardmask layer 20. It may generally be advantageous to only etch back the exposed portions of spin-on hardmask 90, rather than full etching and removing the exposed portions of spin-on hardmask 90, as the remaining unetched portions of spin-on hardmask 90 may protect underlying portions of the lower hardmask layer 20 during removal of mandrel lines 35, as described below.

As described above, there are several disadvantages to forming mandrel cuts in a mandrel patterning layer prior to the etching process used to form the mandrel lines. In the processes described herein, mandrel cuts are not formed in the mandrel patterning layer, but instead the mandrel cuts are defined by mandrel line block masks 95 after non-mandrel lines 60 have been patterned and etched into the upper hardmask layer 25 and after the spacers 55 are formed. The mandrel line block masks 95 may thus not be limited to a width of less than or equal to twice a thickness of spacers 55, and may be made much larger in width if required by design specifications. In addition, because the spacers 55 are not formed in the cuts between the ends of cut mandrel lines 35 and only form on sidewalls of uncut mandrel lines 35, undesirable "necking" effects in non-mandrel lines 60, as described above, may be eliminated.

Figure 12:
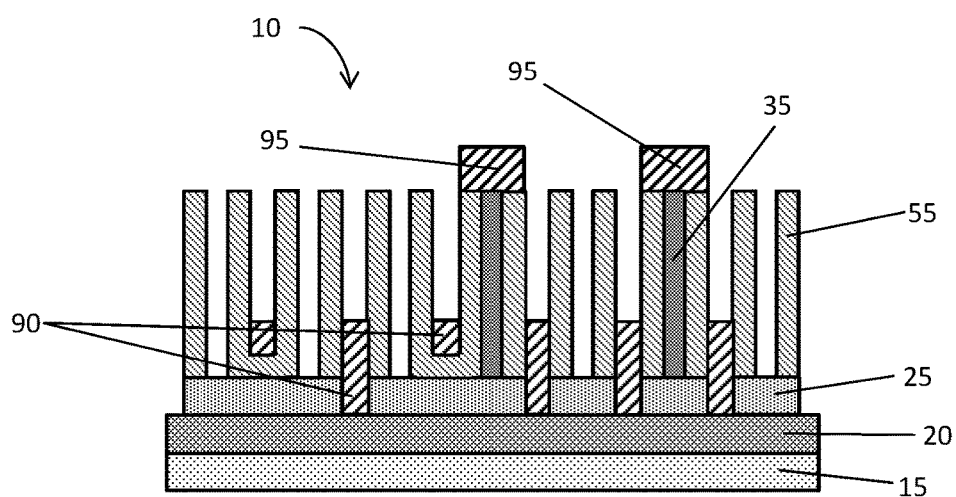

With reference to FIG. 12 in which like reference numerals refer to like features in FIG. 11 and at a subsequent fabrication stage of the processing method, unmasked portions of the mandrel lines 35 are removed with an etching process. Portions of the etched mandrel lines 35 are covered (i.e., masked) and protected by mandrel line block masks 95 during the etching process removing the unmasked (i.e., exposed) portions of the mandrel lines 35. The masked portions and unmasked portions of the mandrel lines 35 are linearly arranged with respective to each other. As illustrated in FIG. 12, the etching process pulling the mandrel lines 35 may also partially etch remaining portions of spin-on hardmask 90 and mandrel line block masks 95. Removing the unmasked portions of the mandrel lines 35 exposes underlying portions of the upper hardmask layer 25 that are arranged in the non-mandrel lines 60 between the spacers 55. Portions of the upper hardmask layer 25 covered mandrel line block masks 95 remain following the etching process.

Figure 13:
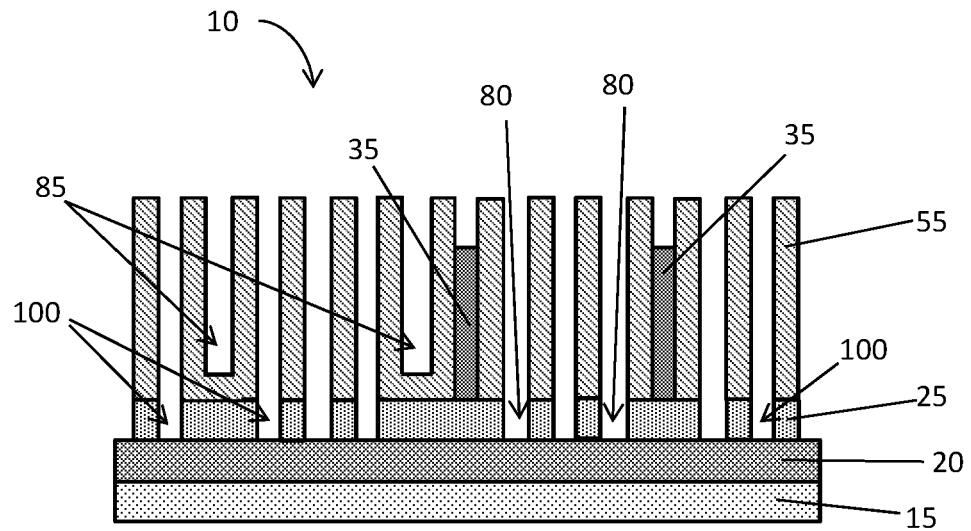
Figure 13A:
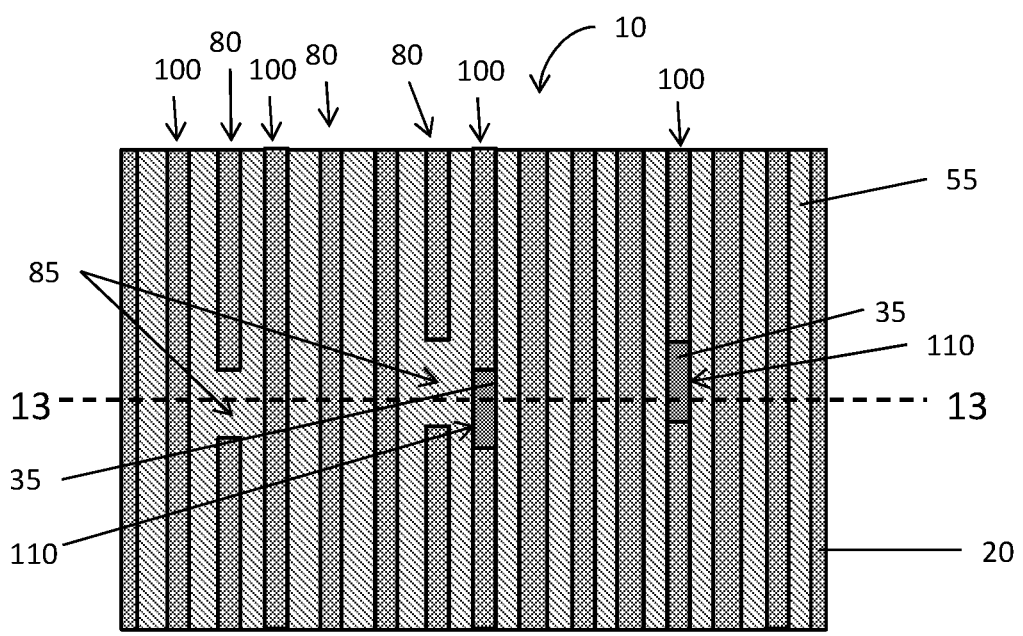

With reference to FIGS. 13 and 13A in which like reference numerals refer to like features in FIG. 12 and at a subsequent fabrication stage of the processing method, the portions of the upper hardmask layer 25 exposed by removal of the mandrel lines 35 are etched to form mandrel line trenches 100 in upper hardmask layer 25. Mandrel line trenches 100, which replicate the pattern of the pulled mandrel lines 35 and mandrel line block masks 95, may be etched in the upper hardmask layer 25, for example, by a selective anisotropic RIE process. Unpulled portions of mandrel lines 35 that remain over the upper hardmask layer 25, due to masking by the mandrel line block masks 95, cover and are associated with mandrel cuts 110 in the mandrel line trenches 100, as best shown in FIG. 13A.

Figure 14:
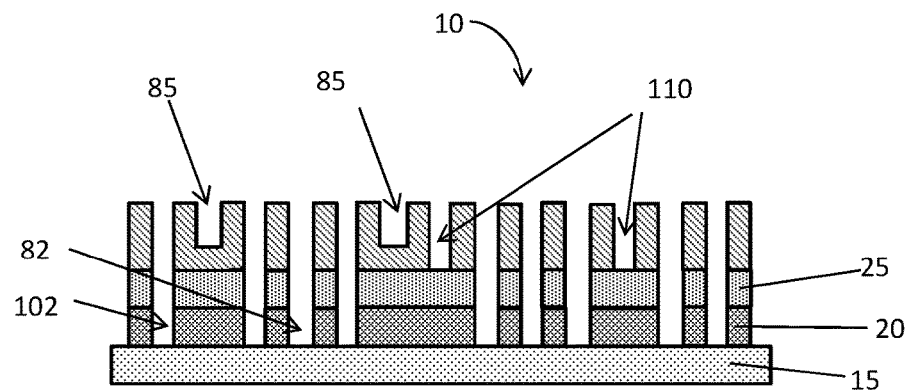
Figure 14A:
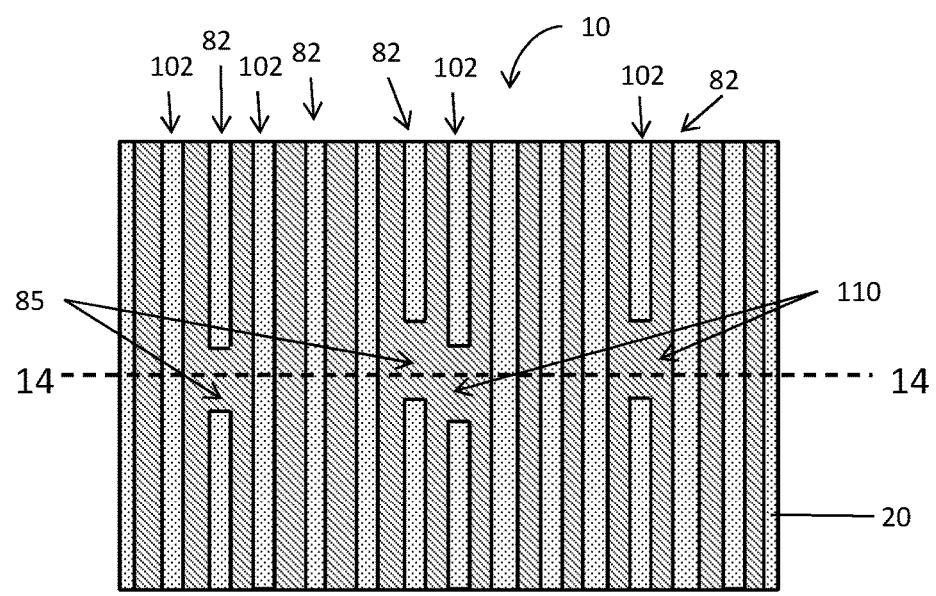

With reference to FIGS. 14 and 14A in which like reference numerals refer to like features in FIGS. 13 and 13A and at a subsequent fabrication stage of the processing method, the remaining portions of the mandrel lines 35 are etched and removed, and the upper hardmask layer 25 is used as an etch mask to etch trenches 82, 102 in the lower hardmask layer 20. The trenches 82, 102 in the lower hardmask layer 20 have the same pattern as non-mandrel line trenches 80, mandrel line trenches 100, the mandrel cuts 110, and the non-mandrel cuts 85 in the upper hardmask layer 25, which is transferred to the upper hardmask layer 25 by the etching process. The trenches 82, 102 in the lower hardmask layer 20 may subsequently be used to etch trenches in the underlying interlayer dielectric layer 15. The trenches in the interlayer dielectric layer 15 are then filled with a metal, such as copper or cobalt, to define metallization lines of a metallization layer.

Figure 15:
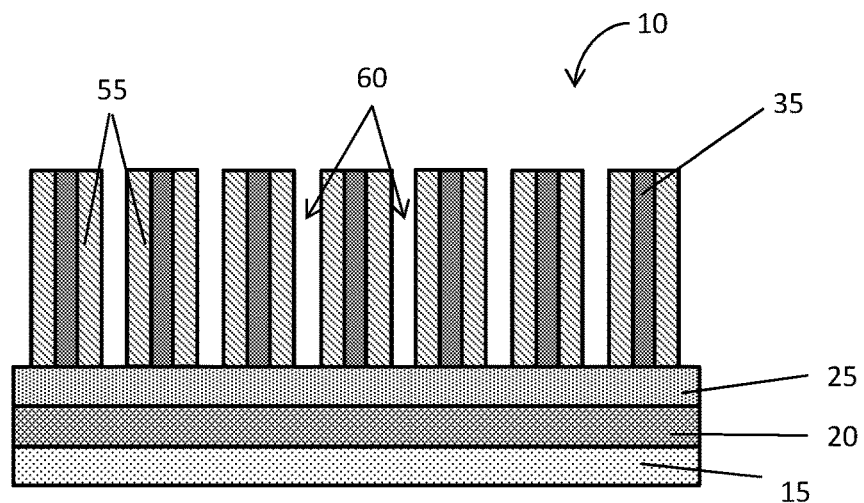

With reference to FIG. 15 in which like reference numerals refer to like features in FIG. 6 and in accordance with alternative embodiments of the processing method, spacer layer 50 may be etched to form spacers 55 without any type of partial masking. The formation of the spacers 55 exposes top surfaces of mandrel lines 35 and portions of the upper hardmask layer 25 between the spacers 55. In the alternative embodiments, the spin-on hardmask 65 is not formed as shown in FIG. 5. The spacer layer 50 may be etched, for example, by an anisotropic RIE process that removes the material of spacer layer 50 selective to the materials of the upper hardmask layer 25 and the mandrel lines 35.

Figure 16:
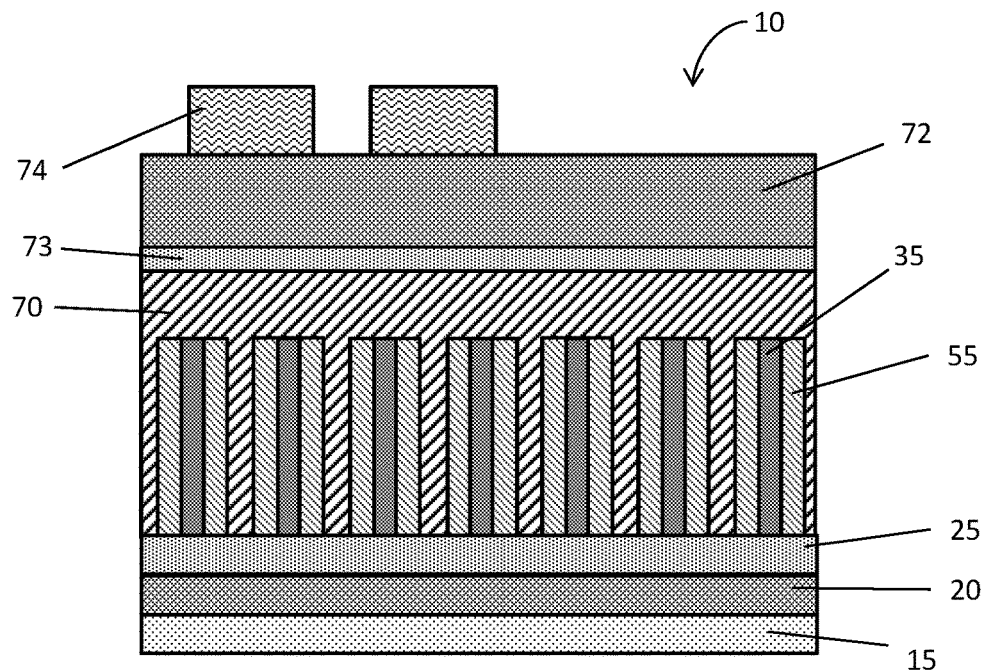

With respect to FIG. 16 in which like reference numerals refer to like features in FIG. 15 and at a subsequent fabrication stage of the processing method, a spin-on hardmask 70 is formed over structure 10 and a sacrificial hardmask layer 73 is formed over spin-on hardmask 70. The sacrificial hardmask layer 73 may be comprised of an oxide of silicon, a nitride of silicon, silicon oxynitride (SiON), silicon carbonitride (SiCN), or another suitable material. In an embodiment, the sacrificial hardmask layer 73 may be comprised of the same material, such as silicon nitride, as the upper hardmask layer 25. Lithography stack 72 and patterned resist 74, as described above in connection with FIG. 8, are formed over sacrificial hardmask layer 73. In an embodiment, the sacrificial hardmask layer 73 is in direct contact with the spin-on hardmask 70. In an alternative embodiment, the sacrificial hardmask layer 73 may be disposed within the lithography stack 72 and may be formed as part of the process of forming lithography stack 72 over spin-on hardmask 70.

Figure 17:
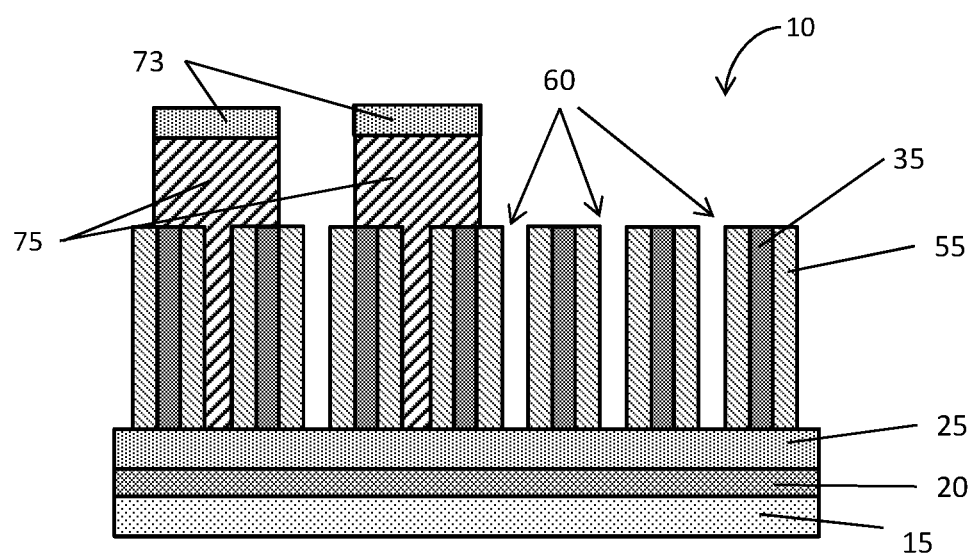

With reference to FIG. 17 in which in which like reference numerals refer to like features in FIG. 16 and at a subsequent fabrication stage of the processing method, unmasked portions of the lithography stack 72 are etched and removed to expose portions of the underlying sacrificial hardmask layer 73, the exposed portions of the sacrificial hardmask layer 73 are removed, and the exposed portions of spin-on hardmask 70 are removed, resulting in non-mandrel block masks 75 with portions of the sacrificial hardmask layer 73 remaining disposed over the non-mandrel block masks 75 and covering the top surface of each of the non-mandrel block masks 75. Subsequently, when exposed portions of the upper hardmask layer 25 are etched to form non-mandrel line trenches 80, as illustrated in FIG. 9, the remaining portions of the sacrificial hardmask layer 73 may also be removed. In embodiments in which sacrificial hardmask layer 73 and upper hardmask layer 25 are comprised of the same material, such as silicon nitride, the etching of non-mandrel line trenches 80 in exposed portions of the upper hardmask layer 25 may fully remove the sacrificial hardmask layer 73 from over non-mandrel block masks 75. The underlying non-mandrel block masks 75 may thus be masked and protected during the etching of non-mandrel line trenches 80 in the upper hardmask layer 25.

Figure 18:
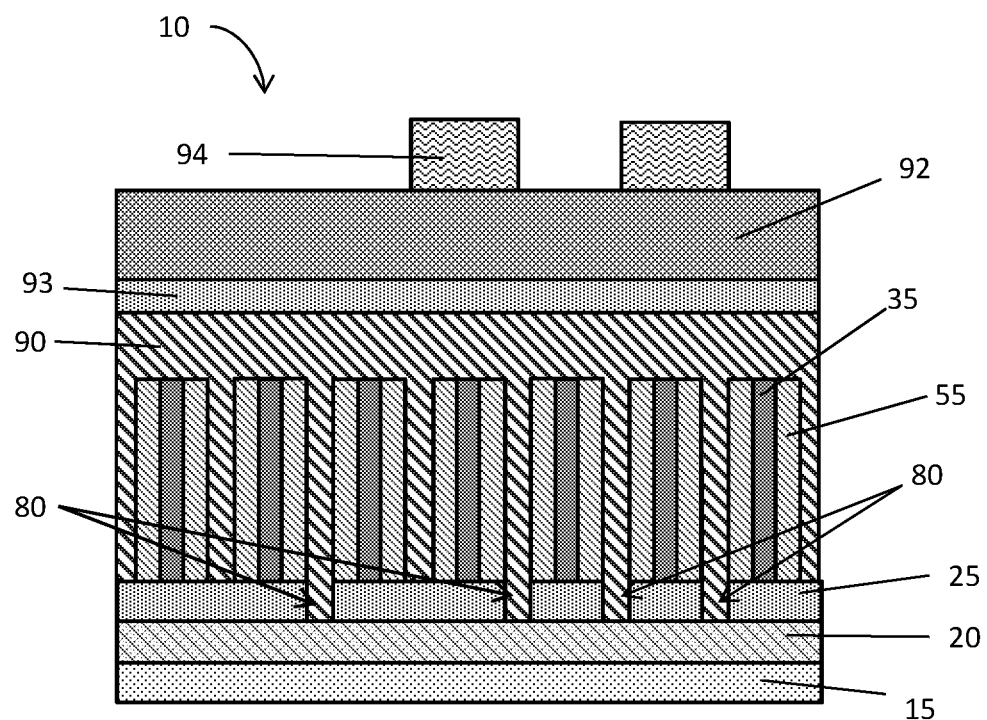

With reference to FIG. 18 in which in which like reference numerals refer to like features in FIG. 17 and at a subsequent fabrication stage of the processing method, a spin-on hardmask 90 is formed as previously described, and a sacrificial hardmask layer 93 is formed over spin-on hardmask 90. Sacrificial hardmask layer 93 may be comprised of any hardmask material, such as an oxide of silicon, a nitride of silicon, silicon oxynitride (SiON), silicon carbonitride (SiCN), or another hardmask material. In an embodiment, the sacrificial hardmask layer 93 may be comprised of the same material, such as silicon nitride, as the upper hardmask layer 25. Lithography stack 92 and patterned resist 94, as described above in connection with FIG. 10, are formed over sacrificial hardmask layer 93. In an alternative embodiment, sacrificial hardmask layer 93 may be disposed within lithography stack 92 and may be formed as part of the process of forming lithography stack 92 over spin-on hardmask 90.

Figure 19:
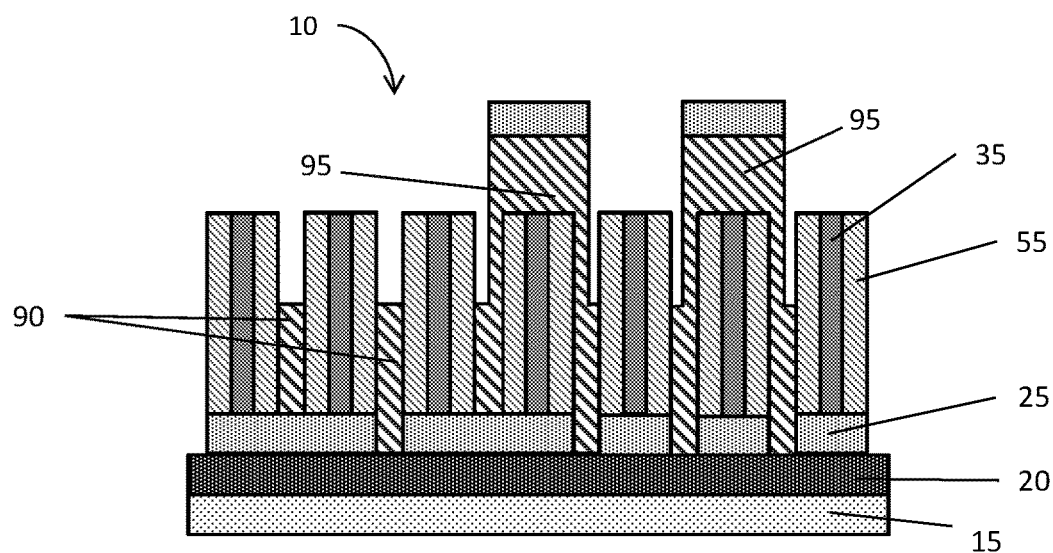

With reference to FIG. 19 in which in which like reference numerals refer to like features in FIG. 18 and at a subsequent fabrication stage of the processing method, exposed portions of the lithography stack 92 are etched and removed to expose portions of the underlying sacrificial hardmask layer 93, the exposed portions of the sacrificial hardmask layer 93 are removed, and the exposed portions of the spin-on hardmask 90 are etched back to expose mandrel lines 35, leaving mandrel line block masks 95 as remnants of the patterning along with overlying portions of sacrificial hardmask layer 93 remaining over the mandrel line block masks 95. Portions of the spin-on hardmask 90 also fill the non-mandrel line trenches 80 in the lower hardmask layer 20.

Figure 20:
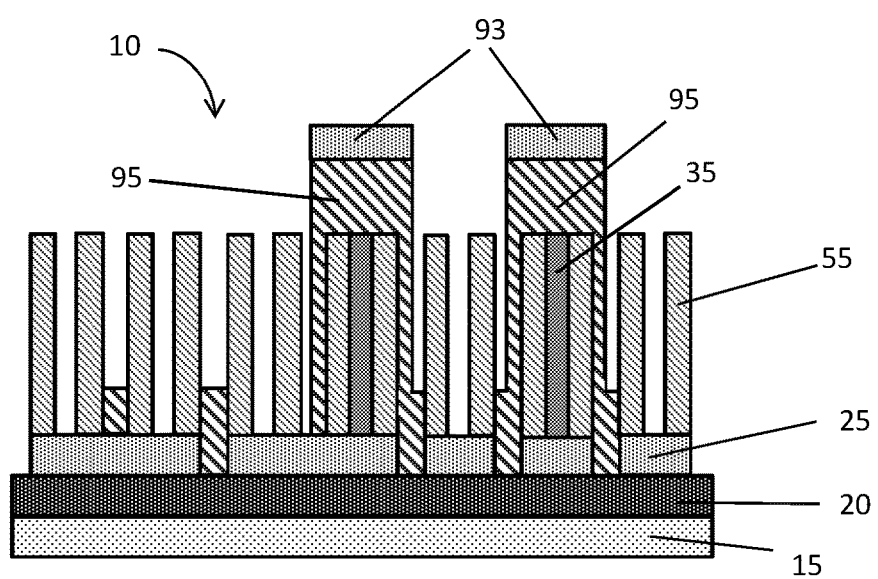

With reference to FIG. 20 in which in which like reference numerals refer to like features in FIG. 19 and at a subsequent fabrication stage of the processing method, unmasked portions of the mandrel lines 35 are etched and removed. Portions of one or more mandrel lines 35 masked and protected by mandrel line block masks 95 remain after the etching. As previously shown in FIG. 12, etching of the material of mandrel lines 35 without the use of sacrificial hardmask layer 93 may also partially etch remaining portions of the spin-on hardmask 90 and mandrel line block masks 95. If the mandrel lines 35 and spacers 55 have very small width dimensions, such as about 10 nm or less, the etch of mandrel lines 35 may over-etch the mandrel line block masks 95, which may result in the underlying mandrel lines 35 being inadvertently removed and thus preventing formation of cuts in the mandrel line trenches 100 etched in later stages. As illustrated in FIG. 20, however, the sections of the sacrificial hardmask layer 93 protects the underlying mandrel line block masks 95 from the mandrel line etch process, preventing the underlying sections of the mandrel lines 35 from being removed and ensuring formation of cuts in mandrel line trenches 100. Following the etching process pulling the mandrel lines 35, the mandrel line trenches 100 may be etched in upper hardmask layer 25; the sacrificial hardmask layer 93 is removed along with the mandrel line trench 100 etch process, and processing may continue as illustrated in FIGS. 13, 13A and FIGS. 14, 14A.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first mandrel line over a hardmask layer;
   forming a first block mask over a first portion of the first mandrel line that is linearly arranged between respective second portions of the first mandrel line; and
   after forming the first block mask, removing the second portions of the first mandrel line with a first etching process to cut the first mandrel line and expose respective first portions of the hardmask layer,
   wherein a second portion of the first mandrel line is covered by the first block mask during the first etching process to define a mandrel cut in the first mandrel line.

2. The method of claim 1 wherein a second mandrel line is formed over the hardmask layer, the second mandrel line is separated from the first mandrel line by a non-mandrel line exposing a strip of the hardmask layer, and further comprising:
   before forming the first block mask, forming a spacer layer over the first mandrel line, the second mandrel line, and the strip of the hardmask layer.

3. The method of claim 2 further comprising:
   forming an etch mask that covers a first portion of the spacer layer over the non-mandrel line and exposes respective second portions of the spacer layer over the first mandrel line and the second mandrel line; and
   after forming the etch mask, removing the second portions of the spacer layer.

4. The method of claim 3 wherein forming the etch mask covering the spacer layer over the non-mandrel line comprises:
   forming a spin-on hardmask over the spacer layer; and
   etching back the spin-on hardmask to expose the second portions of the spacer layer.

5. The method of claim 2 wherein the spacer layer is comprised of an oxide of silicon.

6. The method of claim 2 further comprising:
   after forming the spacer layer, forming a second block mask covering the spacer layer over a first portion of the strip of the hardmask layer.

7. The method of claim 6 wherein the first portion of the strip of the hardmask layer is linearly arranged between respective second portions of the strip of the hardmask layer, and further comprising:
   after forming the second block mask, removing the spacer layer from the second portions of the strip of the hardmask layer with a second etching process,
   wherein a second portion of the spacer layer is covered by the second block mask during the second etching process and defines a non-mandrel cut in the spacer layer.

8. The method of claim 7 further comprising:
forming a sacrificial hardmask over the second block mask,
wherein the sacrificial hardmask has an etch selectivity to the second etching process that is greater than an etch selectivity of the second block mask to the second etching process.

9. The method of claim 1 further comprising:
before forming the first block mask, forming sidewall spacers on the first mandrel line.

10. The method of claim 9 wherein the first block mask overlaps with the sidewall spacers on the first portion of the first mandrel line, the sidewall spacers have a thickness, and the second portions of the first mandrel line are separated by a distance that is greater than twice the thickness of the sidewall spacers.

11. The method of claim 1 further comprising:
removing the first block mask; and
removing the first portions of the hardmask layer with a second etching process to form a first trench and a second trench in the hardmask layer,
wherein a second portion of the hardmask layer is masked by the second portion of the first mandrel line during the second etching process, and the second portion of the hardmask layer is arranged between the first trench and the second trench to transfer the mandrel cut to the hardmask layer.

12. The method of claim 11 wherein the second portion of the first mandrel line is arranged over the second portion of the hardmask layer following the second etching process.

13. The method of claim 1 further comprising:
before removing the second portions of the first mandrel line, forming a sacrificial hardmask over the first block mask,
wherein the sacrificial hardmask has an etch selectivity to the first etching process that is greater than an etch selectivity of the first block mask to the first etching process.

14. The method of claim 13 wherein the sacrificial hardmask is arranged in direct contact with the first block mask.

15. The method of claim 13 further comprising:
after removing the second portions of the first mandrel line, removing the sacrificial hardmask and the first block mask; and
removing the first portions of the hardmask layer with a second etching process to form a first trench and a second trench and to transfer the mandrel cut to a second portion of the hardmask layer.

16. The method of claim 1 wherein a second mandrel line is formed over the hardmask layer, the second mandrel line is separated from the first mandrel line by a non-mandrel line exposing a strip of the hardmask layer, and further comprising:
before forming the first block mask, forming a non-mandrel cut in the strip of the hardmask layer.

17. The method of claim 16 wherein forming the non-mandrel cut in the strip of the hardmask layer comprises:
forming a second block mask over a first portion of the strip of the hardmask layer at a location for the non-mandrel cut.

18. The method of claim 17 wherein the first portion of the strip of the hardmask layer is linearly arranged between respective second portions of the strip of the hardmask layer, and further comprising:
after forming the second block mask, removing the second portions of the strip of the hardmask layer with a second etching process to form a first trench and a second trench,
wherein the first portion of the hardmask layer is covered by the second block mask during the second etching process and defines the non-mandrel cut.

19. The method of claim 18 further comprising:
forming a sacrificial hardmask over the second block mask,
wherein the sacrificial hardmask has an etch selectivity to the second etching process that is greater than an etch selectivity of the second block mask to the second etching process.

20. The method of claim 1 further comprising:
forming sidewall spacers on the first mandrel line before the mandrel cut is defined in the first mandrel line.

* * * * *

UNITED STATES PATENT AND TRADEMARK OFFICE
CERTIFICATE OF CORRECTION

PATENT NO. : 10,395,926 B1
APPLICATION NO. : 15/954736
DATED : August 27, 2019
INVENTOR(S) : Minghao Tang et al.

Page 1 of 1

It is certified that error appears in the above-identified patent and that said Letters Patent is hereby corrected as shown below:

In the Claims
At Column 8, Claim No. 1, Line number 27, change "a second" to --the first--.
At Column 9, Claim No. 11, Line number 24, change "second" to --first--.
At Column 9, Claim No. 12, Line number 29, change "second" to --first--.

Signed and Sealed this
Second Day of June, 2020

Andrei Iancu
*Director of the United States Patent and Trademark Office*